United States Patent [19]

Buck et al.

[11] Patent Number: 5,285,353
[45] Date of Patent: Feb. 8, 1994

[54] SUPPORT BAR FOR CIRCUIT BOARDS

[75] Inventors: Cecil L. Buck, Kokomo, Ind.; Ron C. Stevens, Santa Barbara, Calif.

[73] Assignee: Delco Electronics Corporation, Kokomo, Ind.

[21] Appl. No.: 997,004

[22] Filed: Dec. 28, 1992

[51] Int. Cl.⁵ ............................................. H05K 5/00
[52] U.S. Cl. ..................................... 361/732; 361/730; 361/752; 361/796; 361/759; 211/41; 174/250
[58] Field of Search ............... 361/380, 392, 394, 399, 361/390, 397, 413, 415, 417, 420, 419, 423, 426, 427, 724, 732, 726, 752, 759, 796, 801, 810; 439/64; 174/250, 255; 211/41

[56] References Cited

U.S. PATENT DOCUMENTS

| | | | |
|---|---|---|---|
| 3,567,998 | 3/1971 | Ammerman | 317/101 |
| 3,775,643 | 11/1973 | Schachnow et al. | 317/101 |
| 3,919,738 | 11/1975 | Schmall | 16/110 R |
| 4,016,463 | 4/1977 | Beall et al. | 361/383 |
| 4,079,438 | 3/1978 | Schmall | 361/399 |
| 4,308,548 | 12/1981 | Hurkmans et al. | 346/153.1 |
| 4,405,972 | 9/1983 | Fiorentino et al. | 361/417 |
| 4,517,625 | 5/1985 | Frink et al. | 361/399 |
| 4,609,970 | 9/1986 | Hilpert | 361/399 |
| 4,730,232 | 3/1988 | Lindberg | 361/381 |
| 4,783,720 | 11/1988 | Joist et al. | 361/399 |
| 4,892,431 | 1/1990 | Bachmann et al. | 403/187 |
| 4,896,168 | 1/1990 | Newman et al. | 346/107 R |
| 4,916,575 | 4/1990 | Van Asten | 361/386 |
| 4,958,261 | 9/1990 | Huerre | 361/417 |
| 4,967,311 | 10/1990 | Ferchau et al. | 361/395 |
| 4,970,625 | 11/1990 | Belanger | 361/424 |
| 5,016,142 | 5/1991 | White | 361/415 |
| 5,086,371 | 2/1992 | Grammas et al. | 361/397 |
| 5,157,325 | 10/1992 | Murphy | 324/158 F |

Primary Examiner—Lincoln Donovan
Assistant Examiner—Young Whang
Attorney, Agent, or Firm—Cary W. Brooks

[57] ABSTRACT

Disclosed is a support bar for mounting a circuit board to a housing or case. The support bar includes top and bottom, spaced apart, parallel, substantially straight legs. A base connects the legs so that the legs and the base form a U-shaped groove for receiving a portion of a side of a circuit board. A tab extends outwardly from each end of the top leg of the support bar at an acute angle from the longitudinal axis of the top leg. The tabs have a hole formed therein receiving a releasable connection pin. A hole is formed in the circuit board corresponding to the location of the hole in each of the tabs. The case include platform shoulders for supporting the support bar. The platform shoulders have holes formed therein corresponding to the location of the hole formed in the tab. Releasable connection pins are inserted through the holes in the tab of the circuit board and the housing platform to securely hold the support bar and circuit board in place with reference to the housing. The support bar reduces the deflection of the circuit board due to induced forces or in a random vibration environment such as a moving automobile.

5 Claims, 1 Drawing Sheet

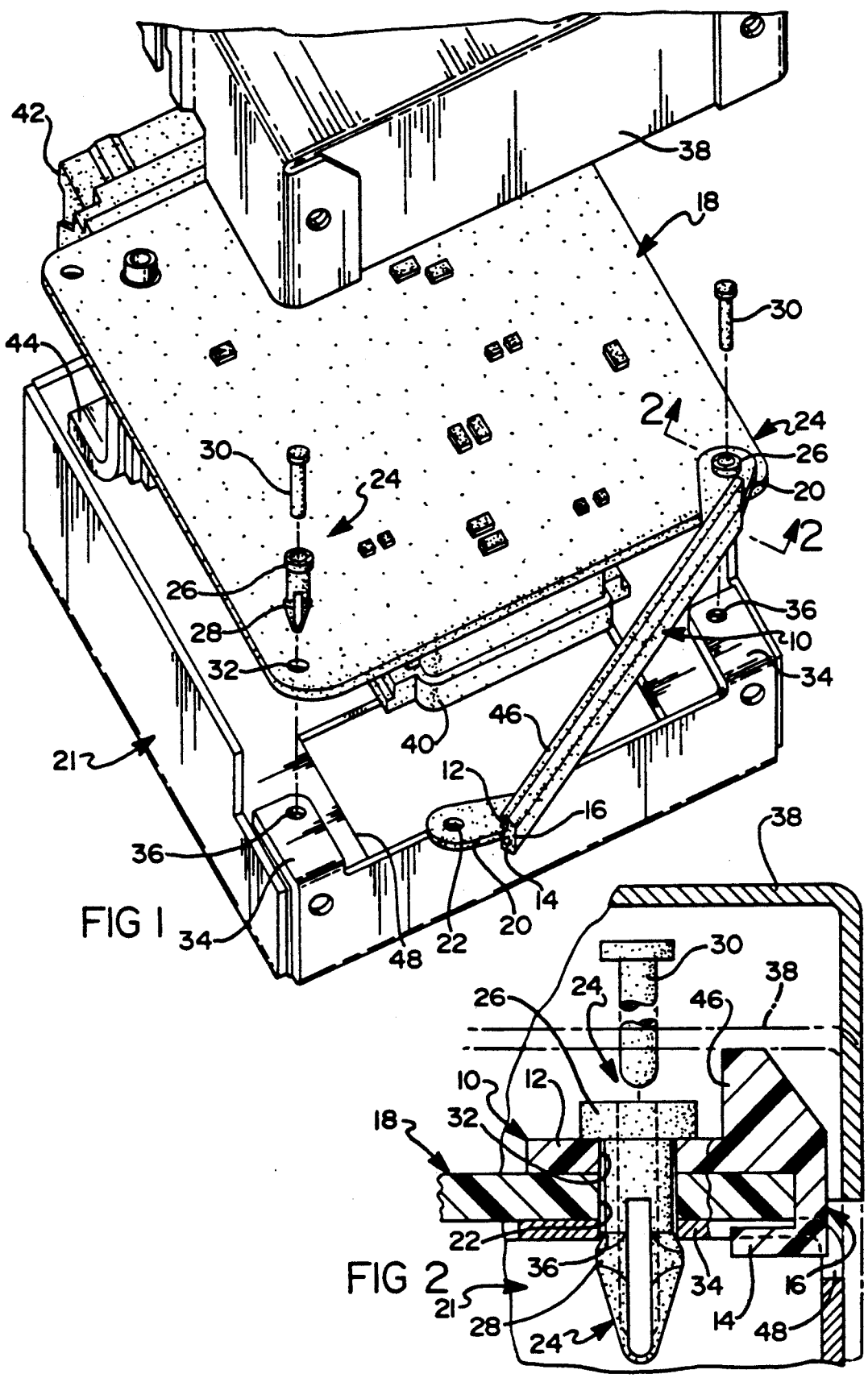

SUPPORT BAR FOR CIRCUIT BOARDS

BACKGROUND OF THE INVENTION

1. Field of the Invention

The invention relates to support bars, and more particularly to support bars for circuit boards effective in reducing circuit board deflection due to induced forces or in a random vibration environment.

2. Description of Related Art

Severe deflection of a circuit board can result in a reduced working life of the circuit or even immediate failure. A circuit board may be subjected to deflection during both insertion and removal of socket devices such as programmable EPROM modules or connectors. Circuit boards can also be subjected to deflection in a random vibration environment. The deflection of the circuit board if severe enough or frequent enough can cause solder joints to break, causing electrical contact to be lost and/or electrical component to be worked loose from the circuit. The present invention overcomes this prior circuit board deflection problem.

SUMMARY OF THE INVENTION

The present invention generally includes a support bar for mounting a circuit board to a housing or case useful in reducing or preventing circuit board deflection due to induced forces or in a random vibration environment. The support bar includes top and bottom, spaced apart, parallel, substantially straight legs. A base connects the legs so that the legs and the base form a U-shaped groove for receiving a portion of a side of a circuit board. A tab extends outwardly from each end of the top leg at an acute angle from the longitudinal axis of the top leg. The tabs have a hole formed therein for receiving a releasable pin.

These and other objects, features and advantages of the present invention will become apparent from the following brief description of the drawings, detailed description, and appended claims and drawings.

BRIEF DESCRIPTION OF THE DRAWINGS

FIG. 1 is a exploded view of a housing, circuit board, support bar and insert pin combination according to the present invention; and FIG. 2 is an enlarged cross-section taken along lines 2—2 of FIG. 1.

DESCRIPTION OF THE PREFERRED EMBODIMENTS

FIG. 1 illustrates a support bar 10 according to the present invention. The support bar includes top 12 and bottom 14 spaced apart, parallel, substantially straight legs. A base 16 connects the top and bottom legs so that the legs and the base form a U-shaped groove for receiving a portion of a side of a circuit board 18. The circuit board is in contact with the top leg of the U-shaped support bar. The bottom leg is spaced a slight distance from the circuit board. A tab extends outward from each end of the top leg at an acute angle from the longitudinal axis of the top leg.

A hole 22 is formed in the tabs of the top leg for receiving a releasable pin 24. Suitable releasable pins are known to those skilled in the art and may include a first member including a hollow shaft having a flared head 26 at one end. A resilient portion is located at the other end of the hollow shaft and includes a flared rim 28. The pin also includes a second member including a rod 30 having a flared head at one end. The rod is inserted into the hollow shaft of the first pin member so as to expand the diameter of the resilient portion. The releasable pin provide adequate clamping force between the circuit board 18, support bar 10 and bottom case housing 21 to minimizing circuit board deflection while providing sufficient space to allow for the differences in thermal expansion of the same items without damage.

Holes 32 are formed in a circuit board to coincide with the holes formed in the support bar. The circuit board is inserted into the U-shaped groove of the support bar. The support bar and the circuit board are supported by a bottom case housing platform shoulders 34 having holes 36 formed therein in alignment with the holes in the tabs and the circuit board. The first member of the pin is inserted into the holes 22, 32, 36 and the resilient portion decreases in diameter so that the flared rim 28 passes through the top leg tab, the circuit board and the bottom case housing platform shoulder. The second member is inserted into the hollow shaft of the first pin member so that the rod expands the diameter of the flared rim preventing it from moving through the holes in the housing, circuit board and tab. The flared head and flared rim prevent the releasable pin from vertical movement in the holes.

As illustrated in FIG. 1, a combination according the present invention includes a housing having a top 38 and bottom 21 case. The bottom case 21 includes platform shoulders 34 for supporting the support bar and the circuit board. The circuit board has electrical components such as an EPROM 40, an electrical connector 42 and a heat sink 44. The bottom case, circuit board and support bar are connected together in the manner described above. The top case 38 is placed over the bottom case 21 and secured thereto in a manner known to those skilled in the art. In the closed position, the top case 38 of the housing engages the top leg 12 or ridge 46 of the support bar 10 (phantom lines in FIG. 2) to sandwich the circuit board between the top case and the bottom case platform shoulder 34 to firmly hold the board in place. Preferably, the top leg of the support bar has a ridge 46 rising above the top leg 12 of the support bar 10 and above the releasable pin/rod 30. The circuit board and support bar have mounting holes 32 and 22 that are sufficiently larger than the releasable pin diameter to allow for the differences in thermal expansion of the said parts.

The support bar when connected to a circuit board in a manner described above is effective in reducing the circuit board deflection during both insertion and removal of socket devices such as programmable EPROM modules and connectors. This particularly advantageous when servicing a device in the field. For example, an EPROM module can be removed through an access opening 48 in the housing. As the EPROM module is pulled off of the circuit board, the housing platform shoulder 34 and the bottom leg 14 of the support board prevents substantial deflection of the circuit board in the downward direction which would otherwise cause solder joint failure. When the EPROM is inserted into a circuit board header (not shown) carried on the circuit board, the upward forces are distributed from the circuit board to the top leg 12 of the support bar and in turn the top case 38 of the housing which engages the top leg ridge 46 of the support bar to prevent substantial deflection of the circuit board and solder joint failure. This system allows field removal and replacement of socket devices without disassembly of the housing and removal of the circuit board to be repaired out in the field.

The support bar also reduces circuit board deflection and stress in a random vibration environment such as in operating an automobile. Reduction of circuit board vibration by the support bar improves performance of the electrical device and prolongs its durability and operating life.

The embodiments of the invention in which an exclusive property or privilege is claimed are defined as follows:

1. A product comprising:
   a housing having a platform shoulder;
   a circuit board having an electric circuit formed thereon including a socket device;
   and a support bar;
   the support bar comprises top and bottom, spaced apart, parallel substantially straight legs and a base connecting the legs so that the base and the legs form a U-shaped groove for receiving a portion of a side of the circuit board;
   a means for securing the support bar to the housing platform for supporting the circuit board and support bar, said circuit board being firmly held by said support bar and housing so that deflection of the board by induced forces from replacement of said socket device is restricted sufficiently to prevent damage to the electrical circuit.

2. The product as set forth in claim 1 wherein said socket device is an EPROM module.

3. The product as set forth in claim 1 wherein said means for securing the support bar to the housing comprises a releasable pin extending through the associated holes in the support bar, circuit board and platform and constructed to provide tolerance for the difference in thermal expansion of the circuit board, support bar and housing.

4. The product as set forth in claim 1 wherein said housing comprises a top case and a bottom case, said bottom case having said platform shoulder, said top case engaging said top leg of the support bar so that said circuit board is firmly held between said top leg and said platform shoulder.

5. The product as set forth in claim 4 wherein said top and bottom cases are secured together and one of said cases having an access opening to remove said socket device without removing said top case from said bottom case.

* * * * *